United States Patent
Yang et al.

(10) Patent No.: US 7,589,551 B1
(45) Date of Patent: Sep. 15, 2009

(54) ON-WAFER AC STRESS TEST CIRCUIT

(75) Inventors: Yun-Chi Yang, Hsinchu County (TW);
Chao-Yung Lai, Miaoli County (TW);
Chao-Yang Lin, Hsinchu County (TW);
Cheng-Li Lin, Taoyuan County (TW);
Kuan-Cheng Su, Hsinchu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 12/107,772

(22) Filed: Apr. 23, 2008

(51) Int. Cl.
*G01R 31/26* (2006.01)
*G01R 31/02* (2006.01)

(52) U.S. Cl. .................... 324/769; 324/760; 324/763

(58) Field of Classification Search ............ 324/769
See application file for complete search history.

(56) References Cited

U.S. PATENT DOCUMENTS 6,693,434 B2 * 2/2004 Chetlur et al. ............... 324/520

* cited by examiner

*Primary Examiner*—Ha Tran T Nguyen
*Assistant Examiner*—Roberto Velez
(74) *Attorney, Agent, or Firm*—Winston Hsu

(57) ABSTRACT

To make an alternating current (AC) stress test easier to perform in a wafer, an AC stress test circuit for performing the AC stress test on a test device fabricated in a test region of the wafer includes an oscillator module fabricated in the test region, a diode module fabricated in the test region coupled to an output of the oscillator module, and a select transistor fabricated in the test region having a gate terminal coupled to an output of the diode module, a second terminal coupled to a gate of the test device, and a third terminal coupled to a test voltage source.

15 Claims, 2 Drawing Sheets

ON-WAFER AC STRESS TEST CIRCUIT

BACKGROUND OF THE INVENTION

1. Field of the Invention

The present invention relates to reliability and acceptance test devices for metal-oxide-semiconductor (MOS) fabrication, and more particularly, to an on-wafer AC stress test circuit.

2. Description of the Prior Art

As electronic devices become more a part of our everyday lives, demand for increased functionality, low power consumption, and smaller size has pushed discrete device fabrication technology into nanometer device sizes, with current processes supporting device sizes of 65 nm, and even 45 nm. Major advantages of smaller geometry device technologies include lower power consumption and ability to fit more dies on a wafer, or more devices on a die. At these dimensions, i.e. with gate lengths of 65 nm and 45 nm, oxide thicknesses decrease to 12 Angstroms (A) and lower.

One major disadvantage of smaller geometry device technologies is reduced life of the devices. Factors that reduce the life of the devices may differ for each progressively shrunken technology. In today's metal-oxide-semiconductor (MOS) technologies, at 65 nm and 45 nm, dielectric breakdown is a primary factor influencing device life. Thus, stress testing, which is a method used for extrapolating the device life by intentionally breaking down the dielectric with a high voltage input, becomes an important tool for determining reliability and yield. For 65 nm devices, which may operate at approximately 1.0V, the prior art relies on a direct current (DC) stress test to determine lifespan of the devices. Examples of typical DC stress tests include hot carrier injection (HCI) tests and Time Dependent Dielectric Breakdown (TDDB).

Please refer to FIG. 1, which is a diagram of a DC stress test setup according to the prior art. In FIG. 1, a typical MOS device 10 is fabricated in a substrate 100, and comprises a poly-silicon gate 110, a source doping region (source) 120, and a drain doping region (drain) 130. An oxide layer 140 is grown over a gap between the source 120 and the drain 130, and may slightly overlap the source 120 and the drain 130. In a 45 nm process, the oxide layer 140 has an oxide thickness under 12 A, and a high-k dielectric material is utilized to form the oxide layer 140, so as to reduce current leakage. To perform a TDDB test, a voltage source is coupled to a gate terminal Vg, and drain voltage or current is measured at a drain terminal Vd. The source 120 and the substrate 100 are both grounded. When the voltage source is applied to the gate terminal Vg, a channel 150 forms in the substrate 100 between the source 120 and the drain 130, which allows charged carriers, such as a charged carrier 151, to flow from the source 120 to the drain 130. However, the high-k dielectric material of the oxide layer 140 introduces phenomena such as Negative Bias Temperature Instability (NBTI), and charge trapping, which causes some charge carriers, such as a charge carrier 152, to be trapped in the oxide layer 140. As charge builds up in the oxide layer 140, a threshold voltage of the device 10 may be changed, degrading accuracy of the DC stress test result.

Charge trapping makes AC stress testing, or pulsed stress testing, ever more important. A typical solution for performing the AC stress test includes coupling an external pulse generator unit to a gate of a test device on a wafer, and measuring change in drain current of the test device. However, this requires external equipment over and above an external connection already utilized for the DC stress test, making the AC stress test hard to integrate with existing DC stress test designs.

SUMMARY OF THE INVENTION

According to the present invention, an alternating current (AC) stress test circuit for performing an AC stress test on a test device fabricated in a test region on a semiconductor wafer comprises an oscillator module fabricated in the test region, a diode module fabricated in the test region coupled to an output of the oscillator module, and a select transistor fabricated in the test region having a gate terminal coupled to an output of the diode module, a second terminal coupled to a gate of the test device, and a third terminal coupled to a test voltage source.

According to the present invention, a method of performing an alternating current (AC) stress test on a test device fabricated in a test region of a semiconductor wafer comprises initializing an oscillator module fabricated in the test region for causing the oscillator module to output an oscillation signal, the oscillator module outputting the oscillation signal through a diode module to alternately turn a select transistor off and on, and the select transistor alternately conducting and insulating a voltage source to and from a gate of the test device according to the oscillation signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
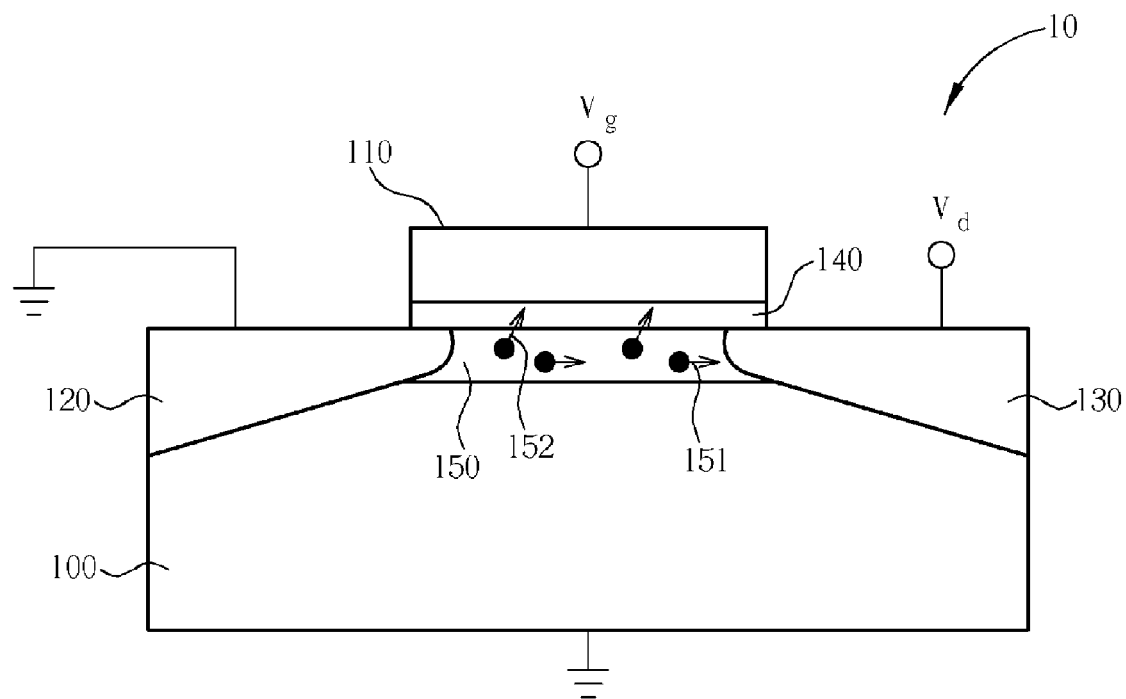
FIG. 1 is a diagram of a DC stress test setup according to the prior art.
Figure 2:
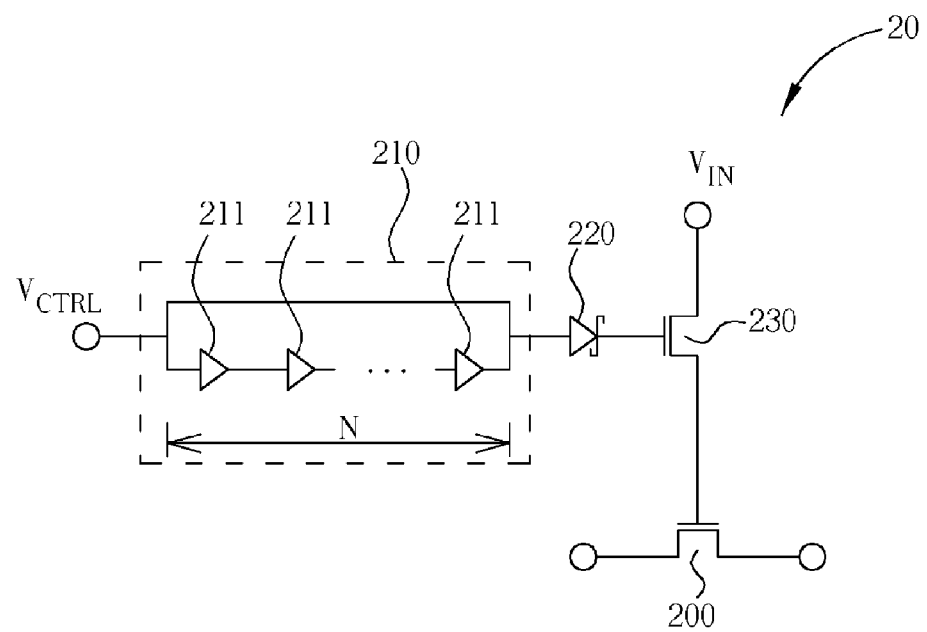
FIG. 2 is a diagram of an AC stress test circuit according to the present invention.

Please refer to FIG. 2, which is a diagram of an AC stress test circuit 20 according to the present invention. The AC stress test circuit 20 is utilized for testing a test device 200, such as a MOS transistor, in a test region of a semiconductor wafer, and comprises an oscillator module 210 fabricated in the test region, a diode module 220 fabricated in the test region coupled to an output of the oscillator module, and a select transistor 230 fabricated in the test region having a gate terminal coupled to an output of the diode module, a second terminal coupled to a gate of the test device, and a third terminal coupled to a test voltage source. The second terminal and the third terminal of the select transistor 230 may represent drain/source terminals of the select transistor 230. The oscillator module 210 may be a ring oscillator as shown, coupled to a control voltage VCTRL for initiating the oscillator module 210, and may comprise a plurality of inverter circuits 211 coupled in series. A number of the plurality of inverter circuits 211 may be an odd number greater than or equal to three. As shown in FIG. 2, the number of the plurality of inverter circuits may be three. Operation of ring oscillators is well known in the art, and not described in further detail here. Of course, while the ring oscillator is preferable in the present invention, an LC tank oscillator, or other type of oscillator, may also be utilized for generating an oscillating signal. The diode module 220 may be a Schottky diode. The select transistor 230 may be a p-type field-effect-transistor (PFET), which may be a normally-on PFET, which may turn off and turn on in response to high and low outputs of the oscillator module 210. Of course, an n-type field-effect-transistor (NFET) could also be used as the select transistor 230.

Figure 3:
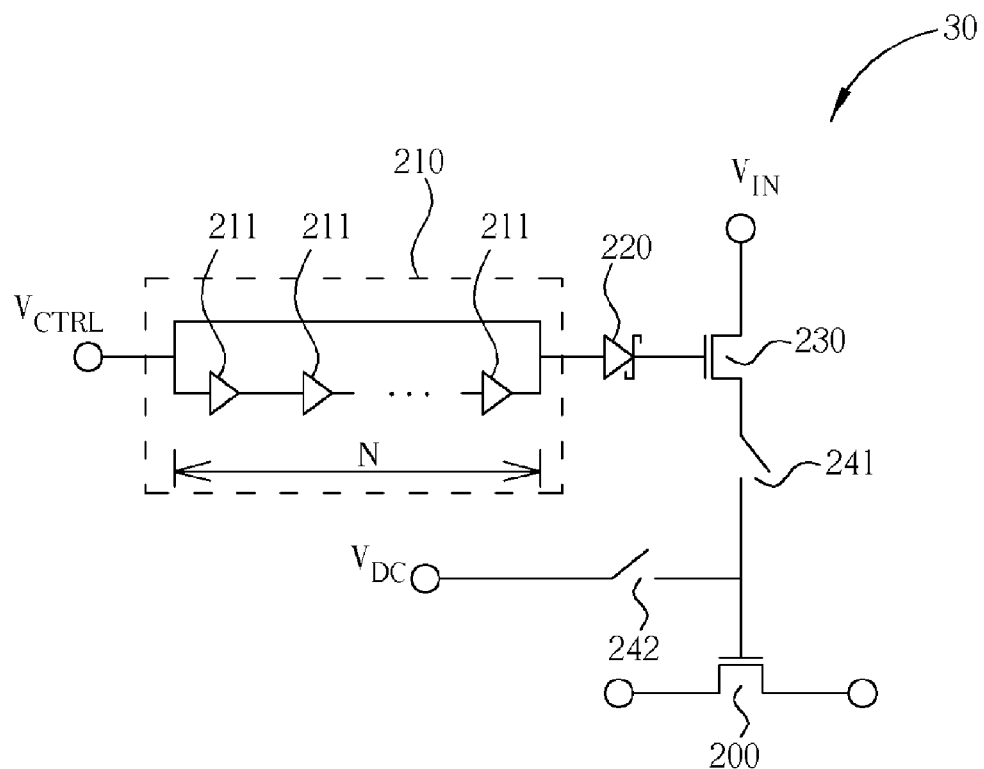
FIG. 3 is a diagram of a second embodiment of the AC stress test circuit of the present invention.

Please refer to FIG. 3, which is a diagram of a second embodiment AC stress test circuit 30 according to the present invention. The AC stress test circuit 30 is similar to the AC stress test circuit 20 of FIG. 2, with addition of a first switch 241 and a second switch 242 for switching between the AC stress test and a DC stress test. The first switch 241 has a first terminal coupled to the second terminal of the select transistor and a second terminal coupled to the gate of the test device for selectively decoupling the test device from the select transistor. The second switch 242 has a first terminal coupled to the gate of the test device 200 and a second terminal coupled to a DC voltage source VDC.

Figure 4:
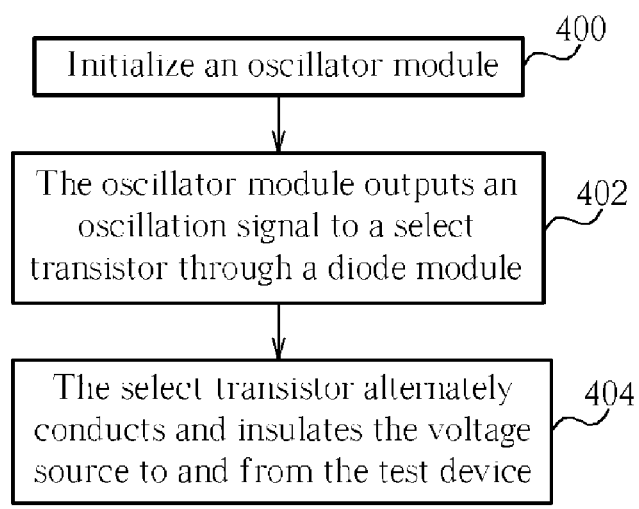
FIG. 4 is a flowchart of a process for performing an AC stress test according to the present invention.

Please refer to FIG. 4, which is a flowchart of a process 40 for utilizing an AC stress test circuit, such as the AC stress test circuit 20, to perform the AC stress test on a test device fabricated in a wafer. The process 40 comprises the following steps:

Step 400: Initialize an oscillator module fabricated in the test region for causing the oscillator module to output an oscillation signal.

Step 402: The oscillator module outputs the oscillation signal through a diode module to alternately turn a select transistor off and on.

Step 404: The select transistor alternately conducts and insulates the voltage source to and from a gate of the test device according to the oscillation signal.

Taking the AC stress test circuit 20 as an example, in Step 400, the oscillator module 210 may be initialized by sending a high or low signal through the control voltage VCTRL. Once the oscillator module 210 is initialized, the oscillator module 210 will begin outputting the oscillation signal to the diode module 220, which will alternately turn the select transistor 230 off and on (Step 402). As the select transistor 230 turns off and on, the select transistor 230 passes the voltage source VIN to the gate of the test device 200 according to the oscillation signal (Step 404). An output may be taken at a terminal of the test device 200 for measuring voltage or current to determine the life of the test device 200.

Compared to the prior art, which requires an external pulse generator unit for performing the AC stress test, the present invention provides an AC stress test circuit that may be fabricated along with a test device in a test region of a semiconductor wafer. A DC voltage source may be utilized in combination with the on-wafer oscillator module, the diode module, and the select transistor to provide an AC signal to the test device for performing the AC stress test. Addition of two switches makes it possible to perform either the AC stress test or a traditional DC stress test using the same AC stress test circuit, which makes the AC stress test circuit easily integrated into current reliability and yield test environments.

Those skilled in the art will readily observe that numerous modifications and alterations of the device and method may be made while retaining the teachings of the invention.

What is claimed is:

1. An alternating current (AC) stress test circuit for performing an AC stress test on a test device fabricated in a test region on a semiconductor wafer, the AC stress test circuit comprising:
    an oscillator module fabricated in the test region;
    a diode module fabricated in the test region coupled to an output of the oscillator module; and
    a select transistor fabricated in the test region having a gate terminal coupled to an output of the diode module, a second terminal coupled to a gate of the test device, and a third terminal coupled to a test voltage source.

2. The AC stress test circuit of claim 1, wherein the oscillator module is a ring oscillator.

3. The AC stress test circuit of claim 2, wherein the ring oscillator comprises a plurality of inverter circuits coupled in series, and a number of the plurality of inverter circuits is an odd number greater than or equal to three.

4. The AC stress test circuit of claim 3, wherein the number of the plurality of inverter circuits is three.

5. The AC stress test circuit of claim 1, wherein the diode module is a Schottky diode.

6. The AC stress test circuit of claim 1, wherein the select transistor is a p-type field-effect-transistor (PFET).

7. The AC stress test circuit of claim 6, wherein the PFET is a normally-on PFET for turning off and turning on in response to high and low outputs of the oscillator module.

8. The AC stress test circuit of claim 1, wherein the oscillator module is an LC tank oscillator.

9. The AC stress test circuit of claim 1, further comprising:
    a switch having a first terminal coupled to the second terminal of the select transistor and a second terminal coupled to the gate of the test device for selectively decoupling the test device from the select transistor.

10. The AC stress test circuit of claim 9, further comprising:
    a second switch having a first terminal coupled to the gate of the test device and a second terminal coupled to a DC voltage source for performing a DC stress test on the test device.

11. A method of performing an alternating current (AC) stress test on a test device fabricated in a test region of a semiconductor wafer, the method comprising:
    initializing an oscillator module fabricated in the test region for causing the oscillator module to output an oscillation signal;
    the oscillator module outputting the oscillation signal through a diode module to alternately turn a select transistor off and on; and
    the select transistor alternately conducting and insulating a voltage source to and from a gate of the test device according to the oscillation signal.

12. The method of claim 11, wherein initializing the oscillator module fabricated in the test region for causing the oscillator module to output the oscillation signal is initializing a ring oscillator fabricated in the test region for causing the ring oscillator to output the oscillation signal.

13. The method of claim 11, wherein the oscillator module outputting the oscillation signal through the diode module to alternately turn the select transistor off and on is the oscillator module outputting the oscillation signal through a Schottky diode to alternately turn the select transistor off and on.

14. The method of claim 11, wherein the oscillator module outputting the oscillation signal through the diode module to alternately turn the select transistor off and on is the oscillator module outputting the oscillation signal through the diode module to alternately turn a p-type field-effect-transistor (PFET) off and on.

15. The method of claim 14, wherein the oscillator module outputting the oscillation signal through the diode module to alternately turn the PFET off and on is the oscillator module outputting the oscillation signal through the diode module to alternately turn a normally-on PFET off and on.

* * * * *